US008581405B2

(12) United States Patent
Dertinger et al.

(10) Patent No.: US 8,581,405 B2
(45) Date of Patent: Nov. 12, 2013

(54) INTEGRATED CIRCUIT HAVING A SEMICONDUCTOR SUBSTRATE WITH BARRIER LAYER

(75) Inventors: Stephan Dertinger, Heidelberg (DE); Alfred Martin, Munich (DE); Barbara Hasler, Munich (DE); Grit Sommer, Grafing (DE); Florian Binder, Gauting (DE)

(73) Assignees: Infineon Technologies AG, Neubiberg (DE); Qimonda AG, Munich (DE)

( * ) Notice: Subject to any disclaimer, the term of this patent is extended or adjusted under 35 U.S.C. 154(b) by 0 days.

(21) Appl. No.: 13/151,408

(22) Filed: Jun. 2, 2011

(65) Prior Publication Data

US 2011/0233630 A1 Sep. 29, 2011

Related U.S. Application Data

(62) Division of application No. 11/828,865, filed on Jul. 26, 2007, now Pat. No. 7,977,798.

(51) Int. Cl.
*H01L 23/48* (2006.01)
*H01L 23/52* (2006.01)

(52) U.S. Cl.
USPC ............................................ 257/751; 257/773

(58) Field of Classification Search
USPC ............ 257/296, 531, 751, E23.01, E29.002, 257/E21.584, E27.016, 532, 773
See application file for complete search history.

(56) References Cited

U.S. PATENT DOCUMENTS

| | | | |
|---|---|---|---|
| 4,874,484 A | 10/1989 | Foell et al. | |
| 5,466,431 A | 11/1995 | Dorfman et al. | |
| 5,753,560 A | 5/1998 | Hong et al. | |
| 6,163,060 A | 12/2000 | Gardner et al. | |
| 6,174,780 B1 * | 1/2001 | Robinson | 438/396 |
| 6,180,511 B1 | 1/2001 | Kim et al. | |
| 6,184,060 B1 | 2/2001 | Siniaguine | |
| 6,229,211 B1 | 5/2001 | Kawanoue et al. | |
| 6,291,885 B1 | 9/2001 | Cabral et al. | |
| 6,784,485 B1 | 8/2004 | Cohen et al. | |
| 6,812,110 B1 | 11/2004 | Basceri et al. | |
| 6,885,105 B2 | 4/2005 | Kakamu et al. | |
| 7,019,399 B2 | 3/2006 | Venkatraman et al. | |
| 7,135,775 B2 | 11/2006 | Chambers et al. | |
| 2002/0050647 A1 | 5/2002 | Ikegami et al. | |
| 2003/0085460 A1 | 5/2003 | Siniaguine | |
| 2004/0124531 A1 | 7/2004 | Venkatraman et al. | |
| 2005/0029587 A1 | 2/2005 | Harshfield | |

(Continued)

FOREIGN PATENT DOCUMENTS

DE 102004031128 1/2006
EP 0296348 3/1993

OTHER PUBLICATIONS

Non-Final Office Action mailed Jan. 6, 2010 in U.S. Appl. No. 11/828,865.

(Continued)

*Primary Examiner* — Hung Vu
(74) *Attorney, Agent, or Firm* — Dicke, Billig & Czaja, PLLC

(57) ABSTRACT

An integrated circuit having a semiconductor substrate with a barrier layer is disclosed. The arrangement includes a semiconductor substrate and a metallic element. A carbon-based barrier layer is disposed between the semiconductor substrate and the metallic element.

6 Claims, 9 Drawing Sheets

(56) References Cited

U.S. PATENT DOCUMENTS

| | | |
|---|---|---|
| 2006/0228897 A1 | 10/2006 | Timans |
| 2007/0048994 A1 | 3/2007 | Tuttle |
| 2008/0014741 A1* | 1/2008 | Chen et al. .................. 438/623 |
| 2008/0296674 A1 | 12/2008 | Graham et al. |

OTHER PUBLICATIONS

Non-Final Office Action mailed Jun. 11, 2010 in U.S. Appl. No. 11/828,865.

Final Office Action mailed Nov. 1, 2010 in U.S. Appl. No. 11/828,865.

Chinese Office Action mailed Jul. 17, 2009.

"Asymmetric pores in a silicon membrane acting as massively parallel brownian ratchets", Sven Matthias, et al. Nature Publishing Group, 2003.

"The Physics of Macropore Formation in Low Doped n-Type Silicon", V. Lehmann, Journal of the Electronchemical Society, vol. 140, No. 10, Oct. 1993.

"Thermal stabiity of titanium nitride diffusion barrier films for advanced silver interconnects", L. Gao, et al., Microelectronic Engineering 76, 2004.

"Through-Hole Interconnections for SI Interposers", Kazuhisa Itoi, et al., European Microelectronics and Packaging Conference & Exhibition, Friedrichshafen, Germany, Jun. 23-25, 2003.

* cited by examiner

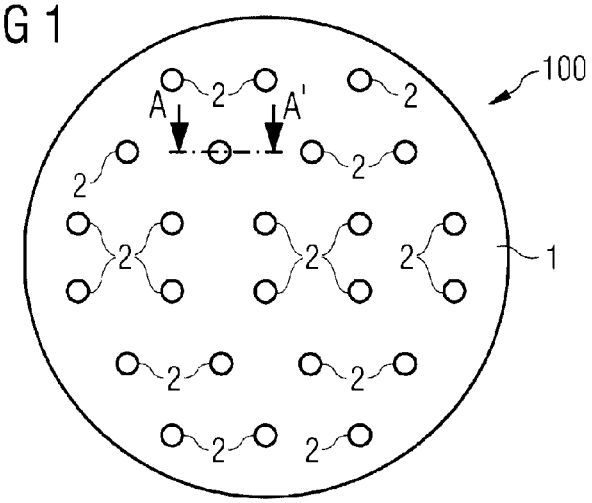
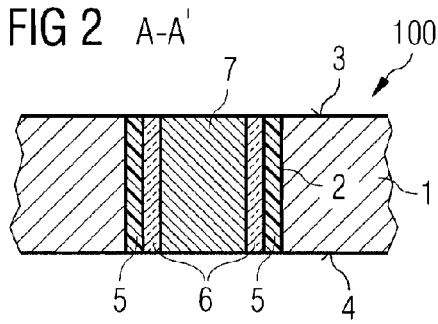
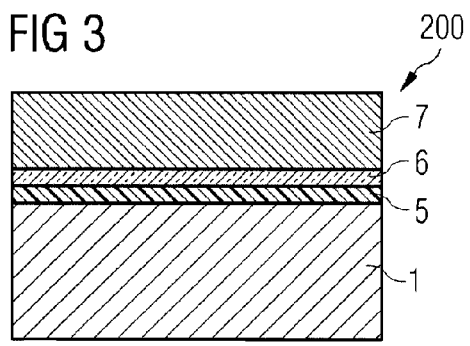
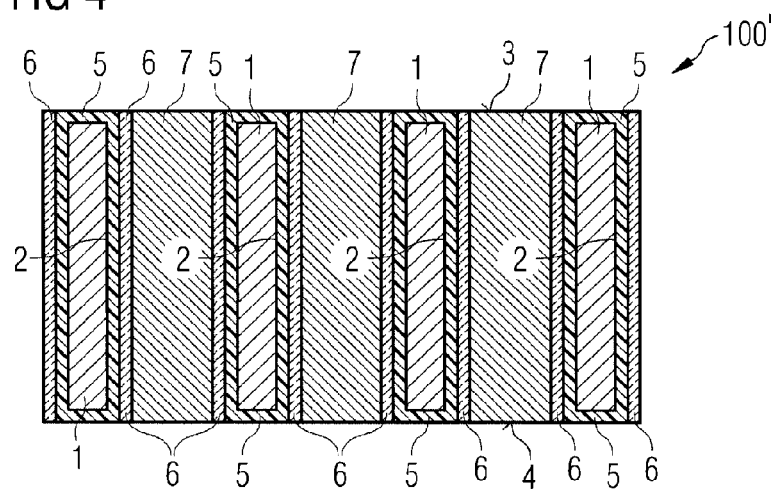

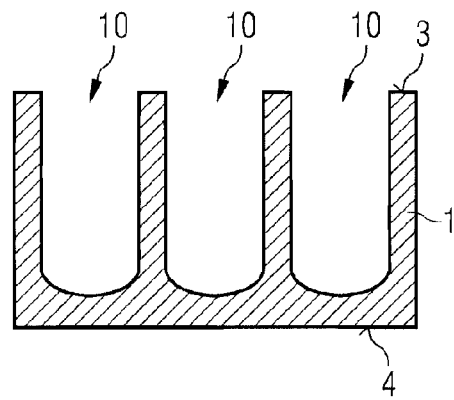
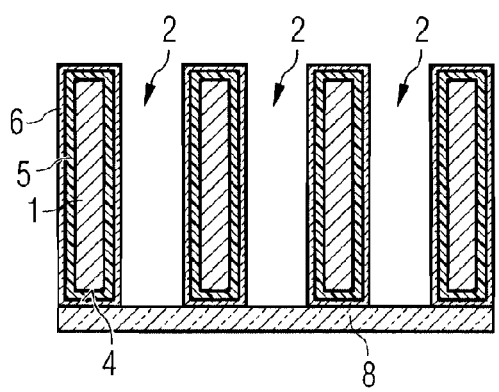
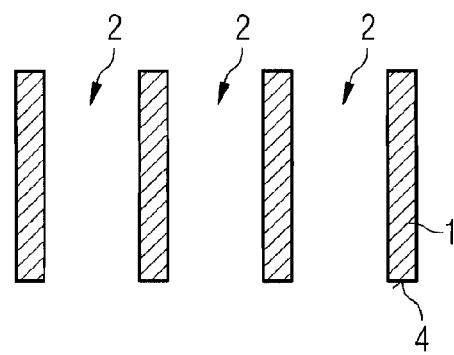
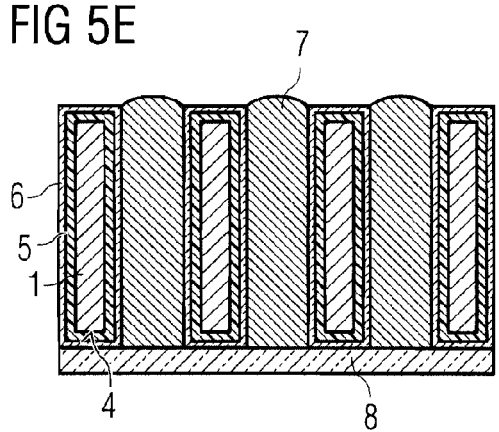
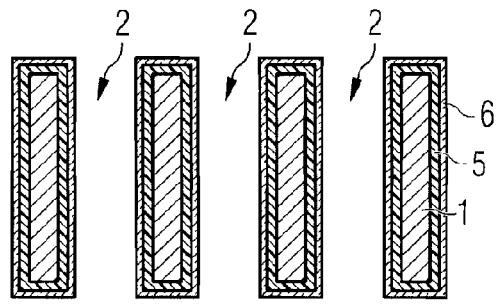
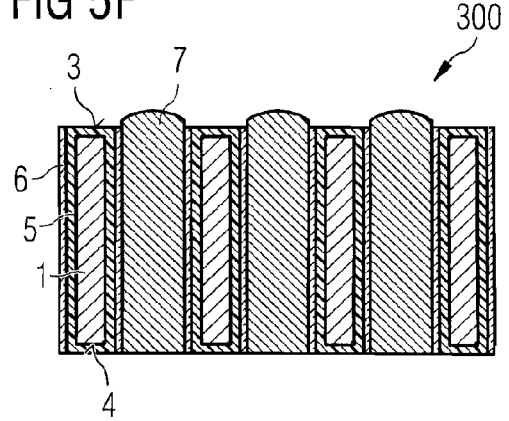

1. Decompressing

ID_CIRCUIT HAVING A
SEMICONDUCTOR SUBSTRATE WITH
BARRIER LAYER

CROSS-REFERENCE TO RELATED APPLICATIONS

This Utility Patent Application is a divisional application of U.S. application Ser. No. 11/828,865, filed Jul. 26, 2007, which is incorporated herein by reference.

BACKGROUND

The invention relates to integrated circuits, sensors or micromechanical devices and substrates on which such integrated circuits, sensors or micromechanical devices are applied on or integrated in.

In order to be able externally to connect integrated circuits, sensors or micromechanical devices, it may be useful for the substrates to be provided with electrically conductive feedthroughs from the substrate topside to the substrate underside.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 is a plan view of an integrated circuit having a semiconductor arrangement including a number of feedthroughs.

FIG. 2 is a cross-sectional view of the semiconductor arrangement across section line A-A' in FIG. 1.

FIG. 3 is a cross-sectional view of another semiconductor arrangement.

FIG. 4 is a cross-sectional view of a semiconductor arrangement having a plurality of feedthroughs.

FIGS. 5A to 5F are illustrations showing a semiconductor arrangement having feedthroughs and a method for producing the semiconductor arrangement.

DETAILED DESCRIPTION

Figure 6A:
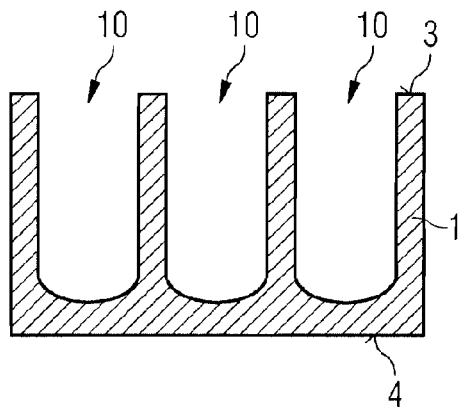
FIGS. 6A to 6F are illustrations showing a semiconductor arrangement having feedthroughs and a method for producing the semiconductor arrangement.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the following, a description of substrates and also methods for producing the substrates is given. The substrates may serve as carriers in order that devices patterned on the micron scale or nanometer scale, e.g., integrated electrical or electro-optical circuits, sensors or micromechanical devices are held in position and/or are externally connected. The substrates may contain semiconductor substrates, in particular silicon substrates, germanium substrates, GaAs substrates, SiC substrates, fully or partially oxidized macroporous silicon, etc. Due to good pattern ability and the electronic properties inherent to semiconductors, the semiconductor substrates may serve both as carriers and components including integrated active component elements, e.g., transistors, diodes, movable structure elements, optical detector or emitter elements, sensor elements, etc. On account of the highly developed semiconductor process technology, the active component elements can be integrated into a semiconductor substrate with a very high density.

If the semiconductor substrates are used as carriers, they can receive one or a plurality of further semiconductor substrates (i.e. "chips") which themselves may serve as carriers and/or into which are integrated active component elements. The chips may be adhesively bonded or soldered onto the carrier substrate, or may be fixed in a similar manner. The electrically conductive contacts between the chips or between the chips and external connections may be produced, if appropriate, via bonding wires, flip-chip bonding or additionally applied interconnects. In this way, a semiconductor substrate can be used as a carrier for producing compact, highly integrated "system in package" (SiP) modules. These modules may be used in the area of communications technology and also automotive, industrial and consumer electronics (e.g., radio-frequency module for mobile telephones, base station or else radar modules for automobiles).

The use of silicon as a substrate carrier has the further advantage that most of the integrated components are likewise integrated into silicon. In this case, a substrate carrier made of silicon would have the same coefficient of thermal expansion (CTE) as the components mounted to it. This reduces the destructive mechanical forces that may form between carrier and component on account of thermal cycles during manufacturing or operation.

The substrate may have merely the function of a carrier for supporting one or more integrated circuits or may embed one or more integrated circuits or may both embed one or more integrated circuits and support one or more other substrates embedding an integrated circuit. The carrier substrates are sometimes also referred to as "interposers" in the art.

As will be explained in greater detail further below, a metallic element is applied to the semiconductor substrate and separated from the surface of the semiconductor substrate by a carbon-based barrier layer. The carbon based barrier layer serves as a barrier to impede the diffusion of metal atoms in the substrate. The diffusion of metal atoms in the substrate (e.g., silicon substrate) is undesired because it leads to a change of the electrical and/or optical properties of the substrate which is difficult to control and may degrade the electrical or optical performance of the substrate. Thus, the carbon-based barrier layer may replace commonly used diffusion barrier layers such as Ta/TaN and Ti/TiN. In this connection, it is to be noted that such conventional barrier layer systems lose their capability to impede diffusion of metal atoms into the underlying substrate at temperatures of about 650° C. or above. In contrast thereto, the thermal stability of the carbon-based barrier layer disposed between the semiconductor substrate and the metallic element may be as high as 2700° C. (i.e. the decomposition temperature of graphite). Consequently, the carbon-based barrier layer may properly act as a metal atom diffusion barrier at temperatures significantly higher than e.g., 700, 1000, 1500, 2000 or even 2500° C. This allows to integrate high temperature processes in the manufacturing process which would otherwise be prohibited for the above explained limitations. Moreover, the use of a carbon-based barrier layer allows to apply the metallic element in a liquid form using a large variety of metallic materials from a molten bath having a high temperature such as 650° C. or more. Therefore, the carbon-based barrier layer allows to use metallic materials having a melting point above 1000° C. such as Cu (melting point 1084° C.), or Ag (melting point 961° C.), aluminum (melting point 660° C.) or alloys on the basis of the aforementioned materials, especially on the basis of Cu and Ag having a melting point higher than 780° C.

Further, if a molten metal is applied, the utilization of a carbon-based barrier layer may allow the reduction of metal-oxides (such as e.g., copper-oxide when using Cu as the metallic material). The reduction of metal-oxides may be accomplished by the formation of $CO_2$ at the carbon-based barrier layer. In other words the carbon-based barrier layer may inhibit the undesired formation of metal-oxides during the manufacturing process.

It is further to be noted that carbon-based barrier layers may easily and inexpensively be produced from the gas phase and may have a high conformity and a high aspect ratio larger e.g., than 1:10. The carbon-based barrier layer is compatible with manufacturing techniques and materials used in the technology of semiconductor processing such as soft-solder, Au, Pb, Zn etc.

According to one embodiment, it is useful for the semiconductor substrate to have electrically conductive feedthroughs reaching from one main surface to the other main surface of the substrate. Such electrically conductive feedthroughs may be implemented in the semiconductor substrate by channels extending through the semiconductor substrate, wherein the metallic element is disposed in the channel. The channels in the semiconductor substrates can have particularly small cross-sectional areas and pitches. Thus, it is possible to produce a channel density on the substrate surface which corresponds to the lateral structural dimensions of an integrated semiconductor component, e.g., a few 100 nm. Interconnects on both sides of the substrate can thus be electrically conductively connected to one another. In this way, it is possible to produce short electronic connections between electronic component elements and components which are arranged on opposite main surfaces of the substrate. As a result, a predetermined substrate surface can be utilized economically, package sizes can be minimized and the outlay for additional interconnect planes can be avoided. For example, it is possible to produce direct connections between an integrated component flip-chip-mounted on one main surface of the semiconductor substrate and contact elements arranged on the other main surface of the substrate. If the positions of the electrically conductive feedthroughs are orientated to the positions of the chip contacts, the feedthroughs can provide for short connections to the contact elements in order that, for example, fast signals (e.g., RF signals) are passed outwards as far as possible in a manner free of interference and free of delay.

If a substrate is provided with an integrated circuit on a front side and electrically conductive feedthroughs are furthermore present, the latter can be used to pass signals of the integrated component directly to the rear side of the substrate. In this way, particularly short electrical connections between the integrated circuit and external connections can be produced with the aid of contact elements soldered onto the electrically conductive feedthroughs. The contact elements on the rear side additionally permit a stack construction in which integrated components can be stacked one above another and be directly contact-connected.

The first and second main surfaces of the semiconductor substrate between which the channels extend are usually the two large opposite areas of the semiconductor substrate. In particular, the main surfaces are the two surfaces of a round mono-crystalline semiconductor wafer or the sawn parts (i.e. "chips") thereof.

As already mentioned, according to one embodiment, the carbon-based barrier layer disposed between the semiconductor substrate and the metallic element may be oriented in a substantially perpendicular direction to a main plane of the semiconductor substrate (e.g., if the carbon-based barrier layer is used in an opening or through-hole of the semiconductor substrate running largely perpendicular to the main plane of the semiconductor substrate) or may be oriented in a plane being substantially parallel to the main plane of the semiconductor substrate (e.g., if the carbon-based barrier layer is used as a barrier layer between a metal-wiring of the semiconductor substrate and the semiconductor substrate). In both cases mentioned above, an insulation layer may be arranged between the semiconductor substrate and the carbon-based barrier layer in order to inhibit any conductive connection or short-circuit between the carbon-based barrier layer and the semiconductor substrate. However, according to another embodiment, the carbon-based barrier layer may also be used in cases where a conductive connection is to be established between a conductive (e.g., metallic) element and a conductive base material on which the carbon-based barrier layer is disposed. For instance, the conductive base material may be a doped region of the semiconductor substrate, a polycrystalline silicon structure or a metal-silicide. Also in this case, the carbon layer will protect the conductive base material underlying the carbon-based barrier layer against metal atom diffusion from the metallic element even during high temperature manufacturing processes in which conventional barrier layer materials such as TiN or TaN would degrade. Thus, the provision of the carbon-based barrier layer allows to implement high temperature manufacturing processes which otherwise could not be utilized for the lack of sufficient thermal stability of conventional barrier layers. Further, also according to the second embodiment, the carbon-based barrier layer may serve as an oxygen trap or barrier capable of reducing metal-oxides at the transition region between the metallic element and the carbon-based barrier layer.

FIG. 1 illustrates a plan view of an integrated circuit having a semiconductor arrangement 100. The semiconductor arrangement 100 includes, for example, a circular semiconductor substrate 1, into which at least one channel 2 has been introduced. As may be seen from FIG. 2, the channel 2 extends from a first main surface 3 to a second main surface 4 of the semiconductor substrates. A hard insulation layer 5 such as $SiO_2$ or $Si_3N_4$ may cover the inner surface of the channel 2. The carbon-based barrier layer 6 is arranged to lie on the hard insulation layer 5. A conductive element 7 made of a metallic material fills the remaining core space of the channel 2 and provides for an electrical feedthrough running through the semiconductor substrate 1. As the outer surface of the conductive element 7 may be completely covered by the carbon-based barrier layer 6, metal atom diffusion or migration into the hard insulation layer 5 and the substrate 1 is effectively prevented by virtue of the carbon-based barrier layer 6.

FIG. 3 illustrates a semiconductor arrangement 200 including a semiconductor substrate 1, a hard insulation layer 5 disposed on the semiconductor substrate 1, a carbon-based barrier layer 6 covering the hard insulation layer 5 and a conductive element 7 made of a metallic element, which is arranged over the carbon-based barrier layer. Throughout the figures, the same reference signs are used to refer to like parts.

In both semiconductor arrangements 100 and 200, the substrate 1 and the layers 5, 6 and 7 may be arranged to be in direct contact to the adjacent layers 5, 6, 7 or may be spaced apart by intermediate layers such as under-coatings or the like. The conductive element 7 may be made, for example, of a metal, e.g., Cu, Ag, Au or alloys thereof or else hard solders (e.g., based on silver (e.g., AgCu28)), soft solders (e.g., based on tin) etc. The conductive element 7 may serve as a feedthrough as illustrated in FIGS. 1 and 2 in conjunction with the semiconductor arrangement 100 or may serve as a contact pad or a metal-wiring for routing signals in a semiconductor device as illustrated in FIG. 3 in conjunction with the semiconductor arrangement 200.

The carbon-based barrier layer 6 may be of polycrystalline carbon. The term polycrystalline carbon as used herein refers to a layer which has sub-areas of graphite-like structure. The sub-areas of graphite-like structure have a size which corresponds to the grain size of the polycrystalline carbon layer and may e.g., be in the range of 1 nm to 2 nm. At the grain boundaries, the hexagonal graphite structure is discontinuous and may be spaced apart by boundary transition regions in which no regular hexagonal graphite structure is present. In other words, the polycrystalline carbon is composed of a plurality of crystalline sub-areas delimited by grain boundaries. The single crystalline sub-areas have a preferential direction, i.e. the polycrystalline carbon forms a layer-like structure. The insulation layer 5 may typically have a thickness in the range of 5 to 1000 nm, in many cases in the range of 100 to 200 nm.

FIG. 4 illustrates a cross-sectional view of a semiconductor arrangement 100' similar to the semiconductor arrangement 100 illustrated in FIG. 2. From FIG. 4, it is apparent that the hard insulation layer 5 may completely enclose the semiconductor substrate 1 resulting in that the conductive elements 7 are securely insulated from each other at the first and second surfaces 3 and 4, respectively, of the semiconductor arrangement 100'. The cross-sectional areas of the channels 2 may be formed, for example, essentially in circular fashion, but may also assume other geometrical forms. The cross-sectional areas of the channels 2 may have values of between a few hundred square-nanometers through to a few square millimeters. Larger or smaller values can not be ruled out, however. The size of the cross-sectional areas may depend on how much current is intended to flow through the electrically conductive feedthrough, whether the electrically conductive feedthrough is also intended to serve for the thermal dissipation of the heat from, for example, heat-generating integrated circuits, whether certain induction or capacitance requirements are intended to be met, etc. Finally, the cross-sectional area may also depend on how many feedthroughs and the density of the feedthroughs that are intended to be produced.

Further semiconductor arrangements 300 to 700 and the production methods thereof are described below with reference to FIGS. 5 to 9. The semiconductor arrangements 300 to 700 represent developments or variations of the semiconductor arrangements 100, 100' as illustrated in FIGS. 1, 2 and 4. The below-described configurations of the semiconductor arrangements 300 to 700 and the production methods thereof can be applied in a corresponding manner to the semiconductor arrangements 100, 100' and vice versa.

FIGS. 5A to 5F and FIGS. 6A to 6F illustrate processes for producing the semiconductor arrangements 300 and 400, respectively, according to a first embodiment of a manufacturing method. In FIGS. 5A and 6A, the semiconductor substrate 1 is provided, into which blind holes 10 are produced at the locations at which later the channels 2 are intended to extend through the semiconductor substrate 1. The production of the blind holes 10 can be effected in many different ways. For example, electrochemical etching constitutes one possible production variant. In order to prepare for the electrochemical etching, the first main surface 3 of the semiconductor substrate 1 is incipiently etched selectively with respect to a mask using, e.g., 10% strength potassium hydroxide solution for e.g., 10 minutes. Afterwards, the first main surface 3 is covered with an electrolyte, e.g., HF acid, and a voltage is applied between the second main surface 4 and the electrolyte. The second main surface 4 is simultaneously irradiated via a light source, e.g., with a wavelength of 800 nm. The intensity of the light source is set such that a predetermined current density, e.g., 10 nA per blind hole, flows between the semiconductor substrate 1 and the electrolyte. As a result of the current between the incipiently etched first main surface 3 of the semiconductor substrate 1 and the electrolyte, pores from at the incipiently etched locations and grow into the semiconductor substrate 1, thereby forming the blind holes 10.

The electromechanical etching can be carried out on p-doped or on n-doped semiconductor substrates 1, in particular silicon semiconductor substrates 1, the resistivity thereof typically lying within a range of 1 to 2000 ohm-cm, and optionally, within the range of 800 to 1200 ohm-cm (i.e. having a relatively low dopant concentration). The form, diameter, depth and density of the blind holes 10 produced depend greatly on the current density, doping, acid strength and etching time and accordingly may have to be determined anew for each new application. As will be explained further below, electrochemical etching opens up the possibility of varying the cross-sectional areas within the individual blind holes 10 by changing etching parameters during the etch operation.

Figure 6D:
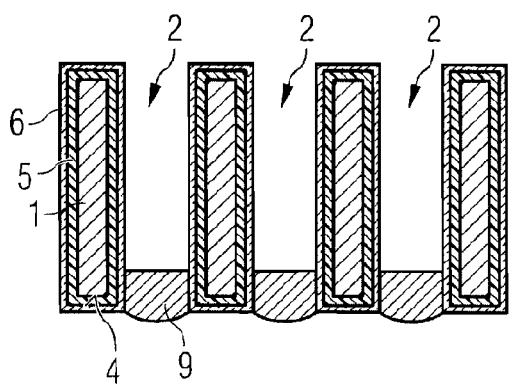
Figure 6B:
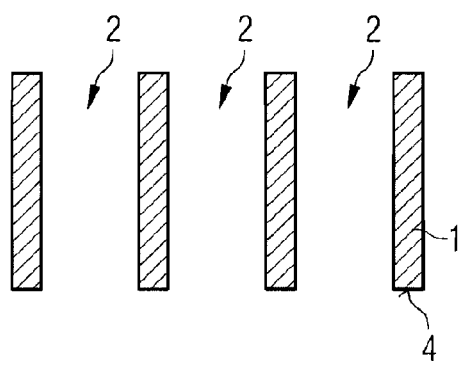

In order to obtain from the blind holes 10 in each case a complete channel 2 from the first main surface 3 to the second main surface 4, the blind holes 10 can be etched further in a further etching step, e.g., via a dry- or wet-chemical etching method, until they reach the second main surface 4 of the semiconductor substrate 1. Alternatively, as illustrated in FIGS. 5B and 6B, the blind holes 10 can be opened by material removal from the second main surface 4. For example, the second main surface can be opened by planarization via chemical-mechanical polishing (CMP).

Instead of the electrochemical etching described above, other etching techniques may also be employed for the production of the blind holes 10 and the channels 2. In principle, the etching methods known in micromechanics, such as, for example, RIE (reactive ion etching) methods, laser drilling, sandblasting or ultrasonic drilling, can be used for this purpose.

The semiconductor substrate 1 may have a thickness within the range of 25 to 2000 µm, and optionally, within the range of 100 to 250 µm. The channels 2 may have a diameter within the range of 2 to 150 µm, and optionally within the range of 10 to 30 µm. The ratio of channel length to channel diameter (aspect ratio) may lie within the range of 2 to 1000, and optionally relatively large aspect ratios above e.g., 5, 10 or even 100 may be present.

Figure 6E:
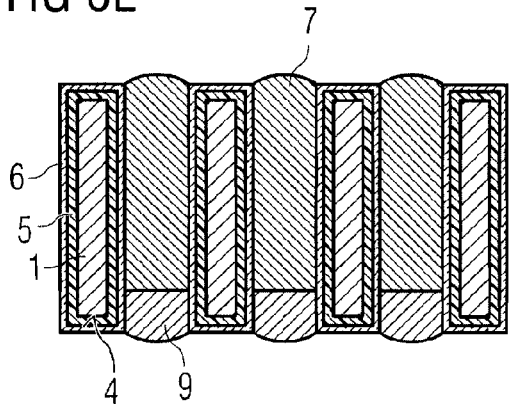
Figure 6C:
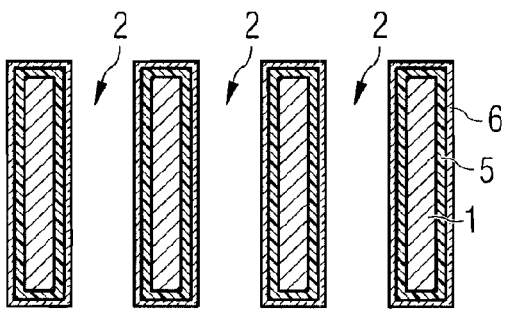

Referring to FIGS. 5C and 6C, in order to electrically insulate the feedthroughs of adjacent channels 2 from one another, the surfaces of the channels 2 can be provided with an insulation layer 5. The insulation layer 5 may be an oxide layer and/or a nitride layer. If the semiconductor substrate 1 is fabricated from silicon, the insulation layer 5 may be e.g., a $SiO_2$ layer which, for example, is produced from TEOS (tetraethylorthosilicate) via a CVD (chemical vapor deposition) process or is sputtered, or a $Si_3N_4$ layer produced from silane ($SiH_4$) and ammonia ($NH_3$). The insulation layer 5 may also be a combination of different insulation layers, e.g., an ONO layer, which is a combination of the aforementioned oxide-nitride-oxide layers.

Furthermore, the insulation layer 5 may be a thermally produced $SiO_2$ layer. The $SiO_2$ layer is not deposited during the thermal oxidation, rather the silicon that is already uncovered on the silicon surface is converted into silicon dioxide by heating (e.g., approximately 900 to 1200° C.) and supplying oxygen. In contrast to silicon dioxide produced in some other way, thermally produced silicon dioxide forms a highly defect-free interface with the silicon lattice. This reduces leakage currents in the silicon at the $Si/SiO_2$ interface. The parasitic capacitance between the electrically conductive materials that are to be introduced later into the channels 2 and the silicon is furthermore minimized. Minimal parasitic capacitances are important particularly for radio-frequency applications.

The thickness of the insulation layer 5 lies within the range of 5 to 1000 nm, and optionally between 100 and 200 nm, depending on the application.

As already mentioned, optionally, not only the surface in the channels 2 but the entire surface of the semiconductor substrate 1, i.e. in the channels 2 and on the two main surfaces 3 and 4 of the semiconductor substrate 1 is provided with the insulation layer 5. In the case of a silicon substrate 1, this can be effected in a single step, e.g., via thermal oxidation or a nitriding of the silicon substrate 1 provided with the channels 2. This is an economical procedure for electrically insulating the semiconductor substrate 1 both in the channels 2 and at the main surfaces 3 and 4 from the conductive materials to be introduced later into the channels 2.

If the insulation layer 5 includes a thermally produced silicon dioxide, the latter can be used on the first and/or second main surface 3, 4 as oxide for the gates of MOS (metal-oxide-semiconductor) transistors. Here, as well, the thermally produced silicon dioxide affords the advantage of a highly defect-free $Si/SiO_2$ interface, thereby minimizing leakage currents in the silicon. Through the use of a thermal oxide as insulation layer 5, the process for producing the feedthroughs through the semiconductor substrate 1 is compatible with standard CMOS processes. This makes it possible to cost-effectively equip a silicon chip or wafer with integrated circuits and with any desired number of feedthroughs.

The carbon-based barrier layer 6 is applied to the insulation layer 5. The barrier layer 6 prevents the electrically conductive materials that are to be introduced into the channels 2 later from diffusing into the semiconductor substrate 1. The barrier layer 6 may be made of a polycrystalline graphite carbon structure as mentioned before and applied to the surfaces of the channels 2 or the insulation layers 5, if present, by vapor deposition such as e.g., a CVD process.

The deposition of the carbon-based barrier layer 6 may be effected by different procedures. A first exemplary process is carried out at a temperature between 900° C. and 970° C., in particular about 950° C. in a reactor chamber. At this temperature, a hydrogen atmosphere of a pressure of about 1 hectopascal (hPa) is generated. Then, a gas containing carbon such as methane ($CH_4$), ethane ($C_2H_6$), ethanol ($C_2H_5OH$), acetylene ($C_2H_4$) is fed in until a total pressure of about 600 hPa is obtained. Under these conditions, polycrystalline carbon is deposited on the surfaces of the substrate 1 or the insulation layer 5. The gas containing carbon is continuously fed into the reactor chamber during the deposition process so as to maintain the total pressure substantially constant.

A second process conducted in a reactor chamber at a temperature of about 800° C. and a hydrogen atmosphere of about 2.4 to 4.0 hPa, especially 3.3 hPa. Heating is accomplished by a common heater and, in addition, a photon-heater, i.e. a light source which provides additional energy via radiation. This allows to lower the temperature compared to the process described above. Then, a gas containing carbon is introduced into the reactor chamber until a partial pressure of about 8.5 to 11.5 or, in particular, 10 hPa of the carbon containing gas is obtained. The same carbon containing gases as mentioned above may be used. Also under these conditions, a polycrystalline carbon layer is deposited on the exposed surfaces and the introduction of the carbon containing gas into the reaction chamber is maintained during the deposition process. In both processes described above, the deposited carbon-based barrier layer 6 has a high degree of conformity. Generally, processes as described above may be carried out at temperatures between 700° C. to 1000° C. and a hydrogen partial pressure of about 1 to 6 hPa.

The thickness of the carbon-based barrier layer 6 may be controlled in both processes by the duration of the deposition process. The carbon-based barrier layer 6 may have a specific resistance of about 1 µΩcm to 100 µΩcm.

The conductivity of the carbon-based barrier layer 6 may be enhanced by doping or intercalation. Conventional dopants such as B, P or as may be used. Intercalation may be accomplished by using suitable metal halides such as arsenic fluoride or antimony fluoride. A specific electric resistance of about 1 µΩcm is possible both by doping or intercalation.

After intercalation, a thermal activation is performed, for instance a selective thermal activation by using a laser.

Then, the channels 2 are closed at the second main surface 4 of the substrate 1. According to FIG. 5D, a sacrificial layer 8 made e.g., from a polymer material or a carbon material may be used. On the other hand, as illustrated in FIG. 6D, the closure of the channels 2 may also be accomplished by plugs 9 which may be made of metal, e.g., Cu, Sn, Al, etc. The plugs 9 may be manufactured by first depositing the metal material on the second main surface 4 of the semiconductor substrate 1 by e.g., using a CVD process or a PVD (physical vapor deposition) process such as sputtering. Then, the metal layer is removed e.g., by CMP to the extend that only the metal plugs 9 depicted in FIG. 6D remain within the channels 2. It is to be noted that due to the CMP process, the plugs 9 are no longer electrically interconnected. Further, the CMP process may be accomplished such that the carbon-based barrier layer at the second main surface 4 is removed so that the plugs 9 are no longer electrically connected.

FIGS. 5E and 6E illustrate the semiconductor arrangements 300 and 400, respectively, after the channels 2 have been filled with the conductive material to form the conductive element 7. The filling of the channels 2 with the conductive material or element 7 serves to provide the material required for an electrically conductive feedthrough, or at least part of the material. The conductive material is optionally filled into the channels 2 above its melting point. The conductive material is chosen in particular such that it has a melting point temperature that is lower than that of the semiconductor substrate 1. One advantage of filling the channels 2 with the conductive material in the liquid state may be that this process may have a higher throughput and lower process costs than conventional types of metal filling, particularly in comparison with depositions effected from the vapor phase (VD) or electrochemical or chemical plating (electroless plating).

For example, Cu (melting point: 1084° C.), Ag (melting point: 962° C.) or Au (melting point: 1064° C.) may be used as electrically conductive material to form the conductive element 7. These materials have very good electrical conductivities and a lower melting point than silicon (melting point: 1410° C.).

Furthermore, hard solders, e.g., based on Ag (e.g., AgCu28), soft solders, e.g., based on tin and further metals, such as e.g., Al, Pd, Zn etc. are also conceivable. The choice of the electrically conductive material can be adapted to the desired requirements or areas of use the semiconductor arrangements 300 and 400, respectively.

The filling of the channels 2 by the conductive elements 7 can be effected channel by channel or in parallel. In order to fill the channels 2 in parallel, the structures illustrated in FIGS. 5D and 6D, respectively, may be dipped into the melt of the electrically conductive material, so that the melt can penetrate into the channels 2 essentially simultaneously. A possible process in this respect will be explained in more detail further below in conjunction with FIGS. 10A to 10D.

Figure 6F:
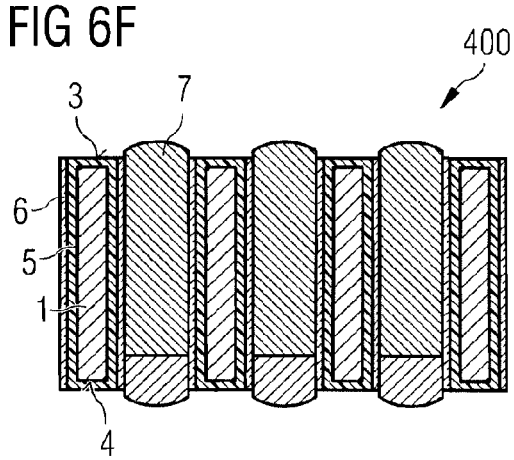

With regard to the semiconductor arrangement 300, in a subsequent step, the sacrificial layer 8 is removed by any suitable process such as etching or burning off this layer 8. then, as depicted in FIG. 5F for the semiconductor arrangement 300 and in FIG. 6F for the semiconductor arrangement 400, the carbon-based barrier layer 6 is removed at the first main surface 3 and the second main surface 4 (if still present there) of the semiconductor substrate 1. Removal of the carbon-based barrier layer 6 may be accomplished by a plasma enhanced dry etching process in a oxygen and/or hydrogen atmosphere. By removing the carbon based barrier layer 6 at the latest, the conductive elements 7 are electrically decoupled from each other.

Figure 7A:
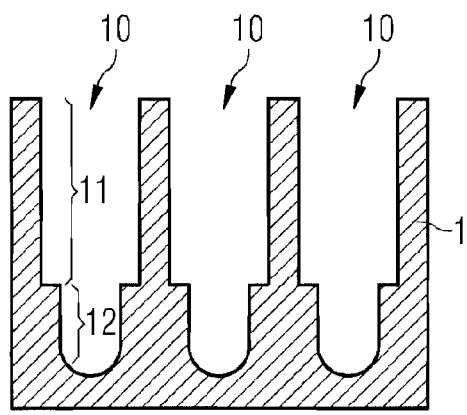
FIGS. 7A to 7E are illustrations showing a semiconductor arrangement having feedthroughs and a method for producing the semiconductor arrangement.
Figure 7D:
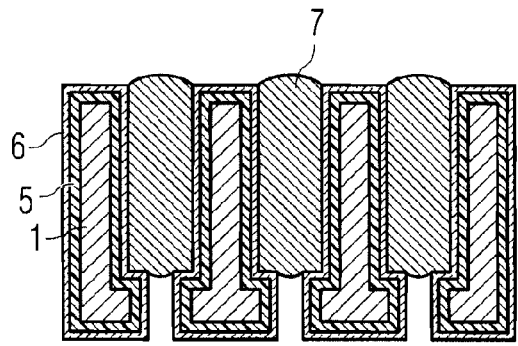

FIGS. 7A to 7E and FIGS. 8A to 8E illustrate a second embodiment of a manufacturing method for producing semiconductor arrangements 500 and 600, respectively. In these manufacturing processes, the channels 2 have a lateral dimension which changes along their extension. More specifically, as illustrated in FIG. 7A, the blind holes 10 may have a larger cross-sectional area in a first section 11 of the blind holes 10 than in a second section 12 of the blind holes 10. For example, if the blind holes 10 are formed by electrochemical etching as explained before, a greater etching current is applied during etching of the first section 11 than during etching of the second section 12. In particular, there is a quadratic dependence between the etching current and the cross-sectional area produced by the electrochemical etching. According to FIG. 8A, the change in cross-sectional area along the depth of the blind hole 10 is a kind of a continuous change, which may be achieved by a continuous variation of the etching current during the etching process. That way, tapered blind holes 10 may be obtained. Further, the aforementioned other etching methods known in micromechanics may be used for forming the blind holes 10 of FIGS. 7A and 8A, as long as these etching methods allow the cross-sectional area of the channels 2 to be varied depending on the depth.

Figure 7B:
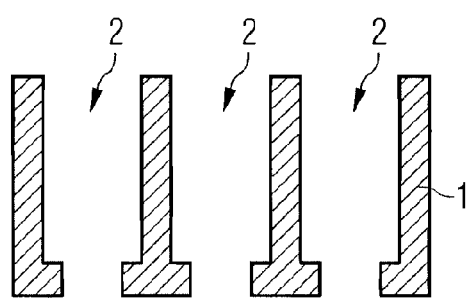
Figure 8A:
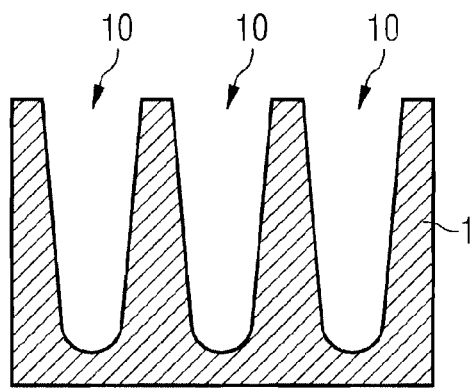
FIGS. 8A to 8E are illustrations showing a semiconductor arrangement having feedthroughs and a method for producing the semiconductor arrangement.
Figure 8D:
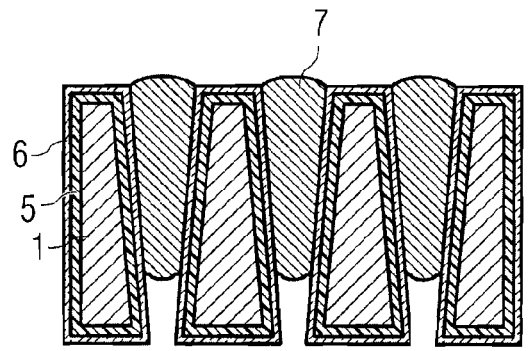
Figure 8B:
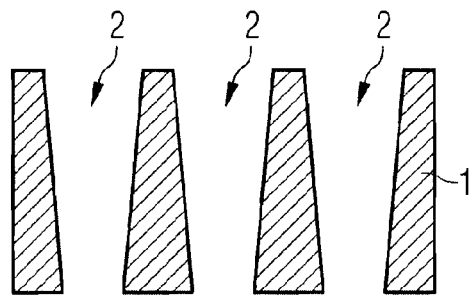

According to FIGS. 7B and 8B, the blind holes 10 are opened at the second main surface 4 of the substrate 1 as has already been described in conjunction with FIGS. 5B and 6B.

Figure 7E:
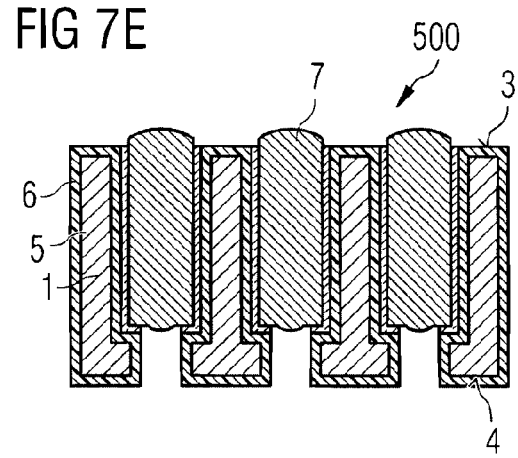
Figure 7C:
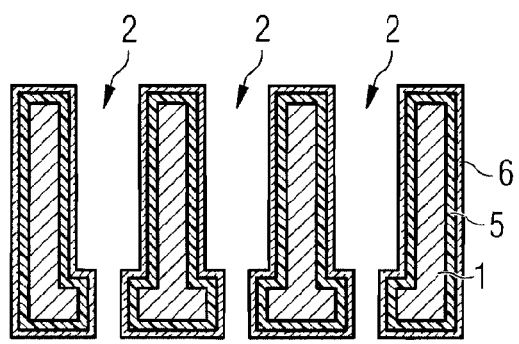
Figure 8E:
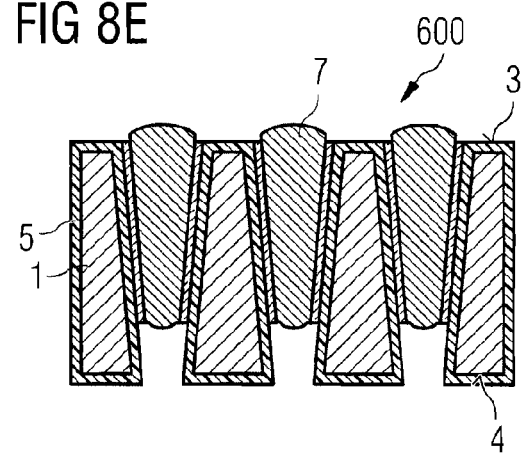
Figure 8C:
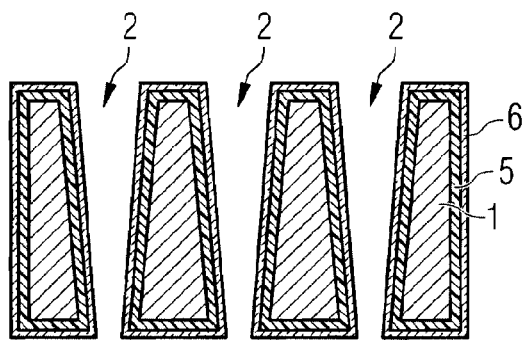

In FIGS. 7C and 8C, the substrate 1 is coated by the insulation layer 5 and the carbon-based barrier layer 6. These processes are accomplished in line with the description to FIGS. 5C and 6C.

The filling of the channels 2 by the conductive elements 7 may be accomplished the same way as already briefly explained in conjunction to FIGS. 5E and 6E. Such filling method will now be explained in more detail with reference to FIGS. 10A to 10D illustrating a molten metal suction method (MMSM).

Figure 10A:
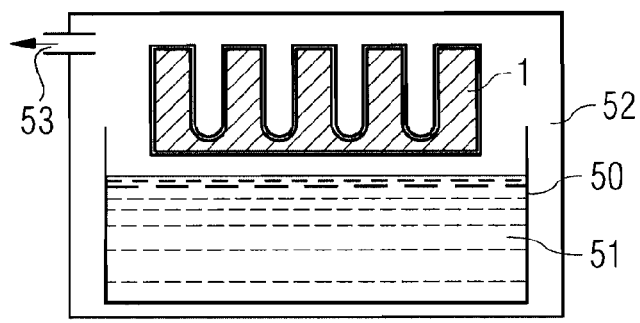
FIGS. 10A to 10D illustrate illustrations of a process for filling blind holes in a substrate using a molten metal suction method.

FIG. 10A illustrates in a schematic fashion a bath 50 of molten metal 51. The molten metal 51 is the material of which the conductive elements 7 are to be made. The bath of molten metal 51 is arranged in a pressure chamber 52, which may be pressurized or decompressed at an inlet/outlet 53.

Figure 10B:
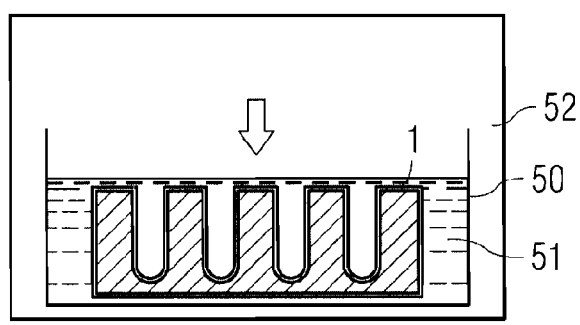
Figure 10C:
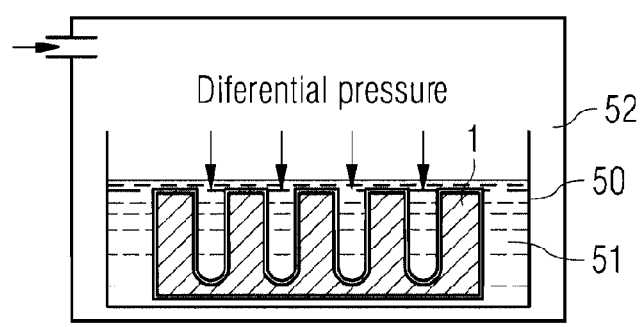
Figure 10D:
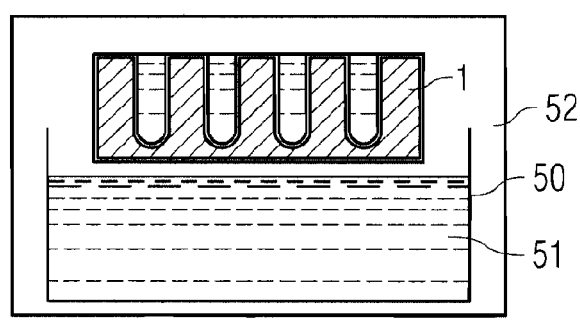

First, the pressure chamber 52 is decompressed, i.e. vacuum is applied. Then, as illustrated in FIG. 10B, the semiconductor substrate 1 as illustrated in FIGS. 5D, 6D, 7C or 8C is immersed into the molten metal bath 50. Then, after about one minute of immersion, the vacuum is broken and a pressure gas is introduced to the chamber 52 up to e.g., atmospheric or sub-atmospheric pressure. At that time, as depicted in FIG. 10C, the channels 2 are filled with molten metal 51 by the differential pressure between vacuum ambience in the holes and pressurized ambience of the chamber 52. After maintaining the pressure for a couple of minutes, the semiconductor substrate 1 is taken out of the molten metal bath 50 and cooled down so that the metal within the channels 2 solidifies. Then, the pressure is released and the semiconductor substrate 1 is removed from the pressure chamber 52.

Thus, the application of a relative reduced pressure makes it possible for even poorly wetting materials to be introduced into narrow channels 2. The smaller the cross-sectional area of the channels, the longer the channels and the poorer the wetting, the greater is the relative reduced pressure required for filling the channels 2. Thus, returning to FIGS. 7D and 8D, on account of the varying widening of the channels 2, regions having different filling pressures are present within a channel 2. Referring to FIGS. 7A to 7E, for the filling of the second section 12 of the channels with a metal or alloy melt, on account of its smaller cross-sectional area, a filling pressure required is greater than that for the first section 11 having the larger cross-sectional area. Likewise, due to the narrowing of the channels 2 in FIGS. 8A to 8D, using a specific filling pressure will result in that the channels 2 are only filled down to a certain depth where the cross-sectional area of the channel 3 corresponds to the utilized specific filling pressure. In both cases, the state in which the entire channel 2 is filled with the melt of the conductive material 51 is undesirable, since the channel 2 would be emptied upon withdrawal from the molten bath 50. Instead, if the filling pressure is set in such a way that only a partial section of the channel length is filled with the melt, the unfilled section functions as a plug preventing the channel 2 from being completely filled with melt and preventing the channel 2 from being emptied when the semiconductor substrate 1 is withdrawn from the molten bath 50. In other words, by virtue of the constriction of the channels 2, the channels 2 behave exactly like blind holes during filling with the material of the conductive element 7. However, after the introduction of the melt, blind holes 10 have to be opened to form continuous channels 2 in order to ultimately provide an electrically conductive feedthrough through the semiconductor substrate 1. This process can be obviated in the case of the procedure illustrated in FIGS. 7 and 8.

The pressure in the airtight pressure chamber 52 at the decompressing process (FIG. 10A) may be within the range of e.g., 0.001 to 100 mbar, and optionally be less than 1 mbar. The pressure required for partial filling of the channels 2 (FIG. 10C) lies within the range of e.g., 1 to 20 bar and optionally within the range of 5 to 10 bar. This filling pressure depends in particular on the process temperature and the surface tension of the conductive material 51.

By virtue of the pressure used during the filling of the channels 2, the surface in the channels 2 need not be provided with an adhesion layer, even in the case of a poorly wetting electrically conductive material 51. Costly additional processing can be avoided by the omission of adhesion layer materials in the channel 2.

Further, filling the channels 2 with a poorly wetting conductive material 51 under pressure may have the effect that, on the one hand, the conductive material 51 then penetrates into the channels 2 and form there an electrically conductive feedthrough or a part thereof after solidification and, on the other hand, beads away from the two main surfaces 3 and 4 of the semiconductor substrate 1. As a result of a beading away, it is possible to avoid layer formation of the conductive material 51 that solidifies by cooling on the two main surfaces 3 and 4. Avoiding such layer formation on the main surfaces 3 and 4 can prevent the semiconductor substrate 1 from being exposed to such high mechanical stresses that it would be damaged in the event of the liquid electrically conductive material 51 cooling and solidifying, on account of different coefficients of thermal expansion.

Then, as illustrated in FIGS. 7E and 8E, the carbon-based barrier layer 6 is removed at the first main surface 3 and the second main surface 4 of the semiconductor substrate 1 using e.g., the method described in conjunction with FIGS. 5F and 6F. Eventually the unfilled narrow section of the channels 2 is filled with a second electrically conductive material (not illustrated in FIGS. 7E and 8E) in order to extend the feedthrough across the entire length of the channel 2. The electrically conductive second material may be chosen in particular such that it has a melting point temperature that is lower than that of the electrically conductive material 51 applied during MMSM. This makes it possible to prevent the conductive material 51 from melting during the filling of the electrically conductive second material into the unfilled sections of the channels 2. In principle, the metals, alloys, hard and soft solders that were mentioned above for the conductive material 51 are also suitable for the conductive second material.

Figure 9A:
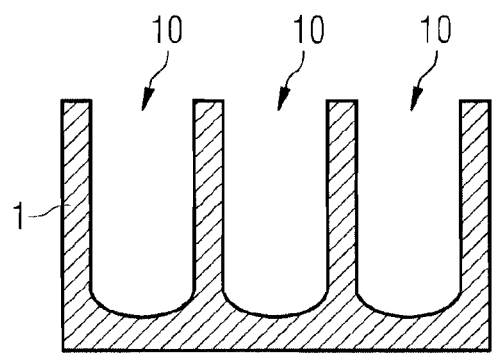
FIGS. 9A to 9D are illustrations showing a semiconductor arrangement having feedthroughs and a method for producing the semiconductor arrangement.
Figure 9C:
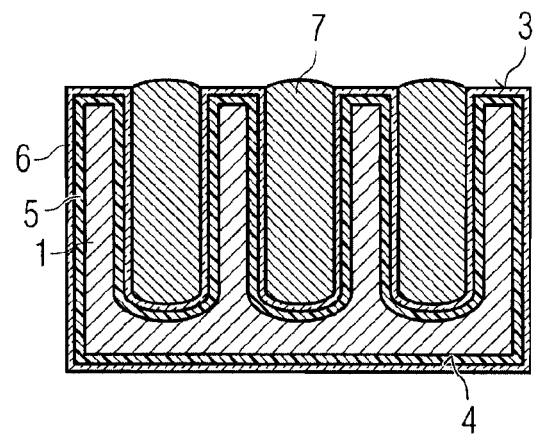
Figure 9B:
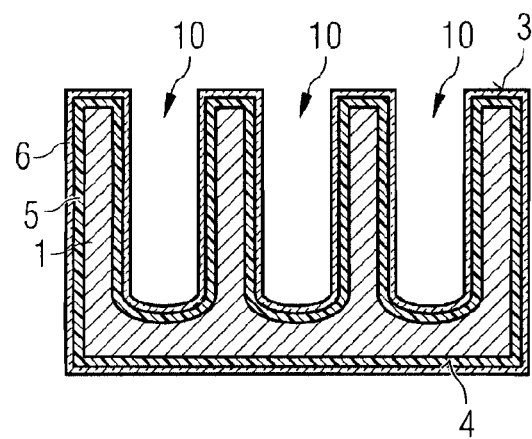
Figure 9D:
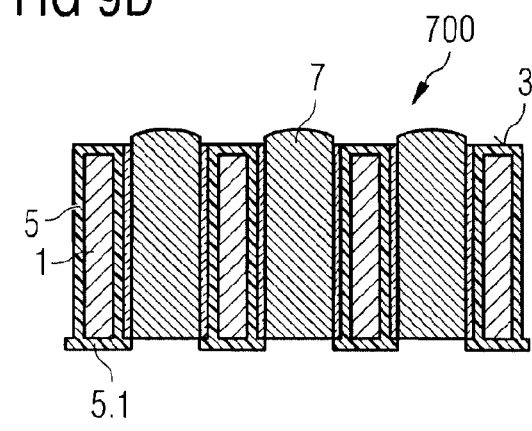

A third embodiment of a manufacturing method for producing a semiconductor arrangement 700 with feedthroughs is illustrated in FIGS. 9A to 9D. After producing blind holes 10 in the semiconductor substrate 1 in accordance with one of the aforementioned methods described in conjunction with FIGS. 5A to 8A, the surface of the semiconductor substrate 1 is covered with the insulation layer 5 and the carbon-based barrier layer 6 (FIG. 9B). Coating of the surface of the semiconductor substrate 1 with these two layers may be accomplished by one of the aforementioned processes. Note that the process of opening the blind hole 10 at the second main surface 4 of the semiconductor substrate 1 as illustrated in FIGS. 5B to 8B is skipped.

Then, the metal element 7 is generated within the coated blind holes 10, e.g., by using the MMSM process as described further above. After solidification of the molten metal 51 forming the metallic element 7, the blind holes 10 are opened at the second main surface 4 of the semiconductor substrate 1. The opening of the blind holes 10 may be accomplished e.g., by a CMP method. Consequently, the semiconductor substrate 1 is again covered with an insulation layer 5 at the exposed second main surface 4 of the semiconductor substrate 1. This newly applied insulation layer 5 is then opened at the locations of the metallic elements 7 in order to expose these metallic elements 7. The opening of the insulation layer 5 may be accomplished by lithographic techniques. The remaining portions of the insulation layer 5 at the second main surface 4 of the semiconductor substrate 1 is denoted by reference sign 5.1 in FIG. 9D.

Further, as already described in conjunction with FIGS. 5F, 6F, 7E and 8E, the exposed parts of the carbon-based barrier layer 6 is removed for instance by using the same techniques as described above.

Figure 11:
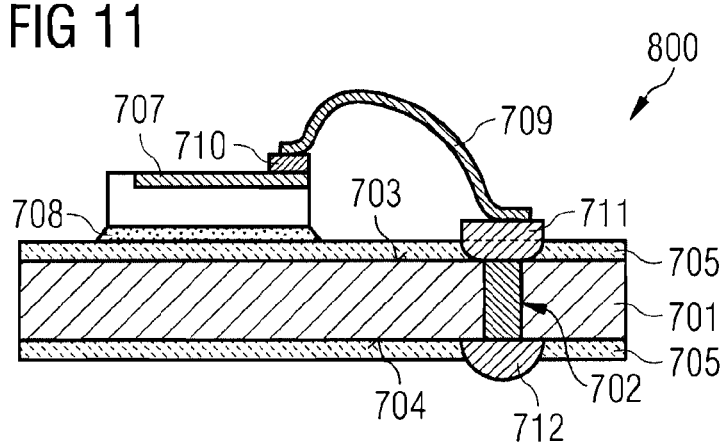
FIG. 11 is a schematic illustration of a semiconductor module.

FIG. 11 schematically illustrates a semiconductor module 800 including a substrate 701 having a feedthrough 702 extending from the first main surface 703 to the second main surface 704. The feedthrough 702 has been produced by one of the methods described above. The substrate 701 is, for example, a silicon chip and the insulation layers 705 applied to the first and second main surfaces 703, 704 of the substrate 701 are an oxide.

The rear side of an integrated semiconductor component 706 having an integrated circuit 707 on the front side has been adhesively bonded on to the oxide layer 705 via an adhesive 708. The semiconductor component 706 is electrically connected to the substrate 701 via a bonding wire 709 leading from a bonding contact location 710 of the semiconductor component 706 to a bonding contact location 711 of the substrate 701. In the present case, the bonding contact location 711 of the substrate 701 has been applied directly to the feedthrough 702 of the substrate 701. Thereby, the bonding wire 709 is directly connected to an external contact 712, e.g., a solder ball 712.

The contact-connection of the bonding contact location 711 to the feedthrough 702 is effected in a manner that is well known to one of ordinary skill in the art: first, the oxide layer 705 on the first main surface 703 has to be opened at the location of the feedthrough 702. This may be effected via selectively etching with respect to a photolithographically produced mask (not illustrated). Thereafter, a metal layer (e.g., aluminum) is applied to the oxide layer 705 and patterned photolithographically in such a way that a layer element 711, that is large enough for a wire connection 711, remains.

The contact-connection of the solder ball 712 is effected analogously in a manner known to one of ordinary skill in the art: first, the oxide layer 705 on the second main surface 704 has to be opened at the location of the feedthrough 702. This may be effected via selectively etching with respect to a photolithographically produced mask (not illustrated). Thereafter, the second main surface 704 is brought into contact with a copper solder melt, so that the copper solder wets the surface of the feedthrough 702. A ball-type solder ball 712 remains after cooling.

Figure 12:
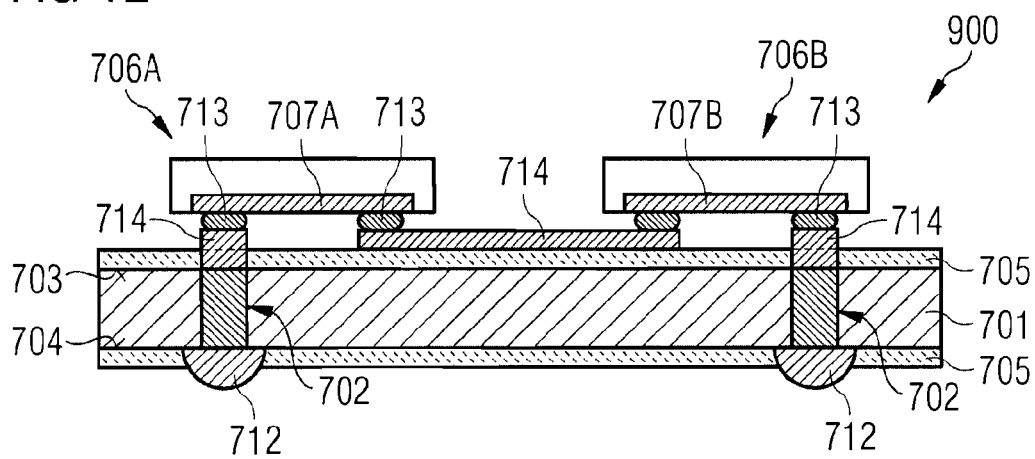
FIG. 12 is a schematic illustration of a semiconductor module.

FIG. 12 schematically illustrates a further semiconductor module 900 with a substrate 701, including two feedthroughs 702 from the first main surface 703 to the second main surface 704. The semiconductor module 900 is constructed like that of FIG. 11. However, in contrast to FIG. 11, the present semiconductor module 900 includes two integrated components 706A, 706B which have been applied to the substrate 701 by their front sides, i.e., by the side including the integrated circuits 707A, 707B. In this case, the electrical connection to the substrate 701 is not effected via bonding wires but rather via solder ball contacts 713 which connect the bonding contact locations of the integrated components 706A, 706B to interconnects 714 applied on the substrate 701. This bonding method is also known by the term "flip-chip bonding".

As can be gathered from FIG. 12, some interconnects 714 run directly over feedthroughs 702 and are electrically conductively connected to the latter. In this way, it is possible to lead bonding contact locations of the integrated components 706A, 706B via the feedthroughs 702 directly to one of the external contacts 712. This saves long interconnects and improves signal transmission, particularly at high frequencies.

It can be gathered from FIG. 12, furthermore, that some interconnects 714 run in such a way that they connect the bonding contact locations of one integrated component 706A to those of the other integrated component 706B. In this way, different integrated circuits 706A, 706B can be connected to one another without requiring further external contacts 712. Integrated circuits can thus be packed even more densely.

It should be pointed out that the embodiments of FIGS. 11 and 12 have silicon wafers or silicon chips as substrate 701. This has the advantage that the coefficient of thermal expansion (CTE) of the substrate 702 is the same as that of the integrated circuits, which are usually likewise produced on a silicon basis. This helps to reduce mechanical stresses between the substrate 702 and the integrated component 706. Furthermore, in comparison with, for example, a ceramic, silicon has a good thermal conductivity in order to effectively dissipate the heat generated by the integrated circuits. Furthermore, the etching of blind holes in an electrochemical manner can be carried out particularly effectively using silicon.

Figure 13:
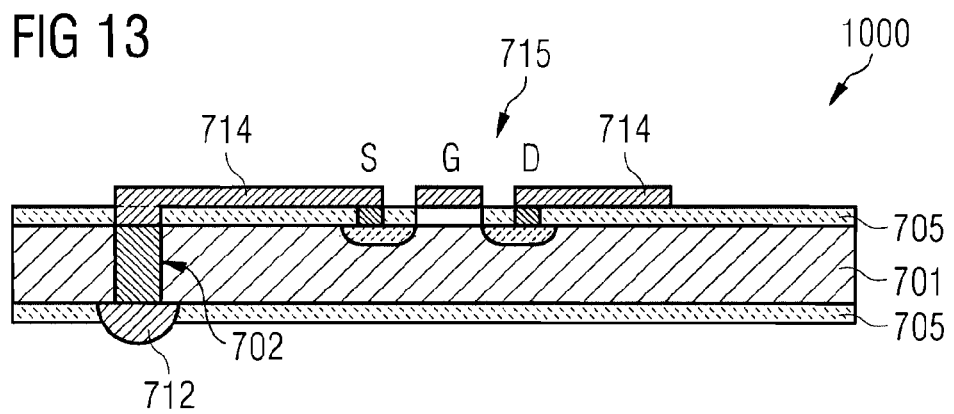
FIG. 13 is a schematic illustration of a further semiconductor module.

FIG. 13 schematically illustrates a further semiconductor module 1000 with a substrate 701 including a feedthrough 702 extending from the first main surface 703 to the second main surface 704. The semiconductor module 1000 is constructed like that from FIG. 11. However, in contrast to FIG. 11, the integrated circuit 707 is integrated into the substrate 701. FIG. 13 illustrates a transistor 715 for example. Source S and drain D of the transistor 715 are produced by doping of the monocrystalline silicon substrate 701, while the gate G is produced by thermal oxidation, which arose, for example, during the production of the insulation layer 705. FIG. 13 furthermore illustrates interconnects 714 which connect the source S to the feedthrough 702 and/or respectively make contact with the gate G and the drain D. In this way, the feedthrough 702 enables short connecting links of the active and passive components of the integrated circuits (e.g., resistors, transistors, diodes, coils, capacitors, etc.) to the external connections, thereby obviating long interconnections and hence the need for multiple interconnect planes.

Figure 14:
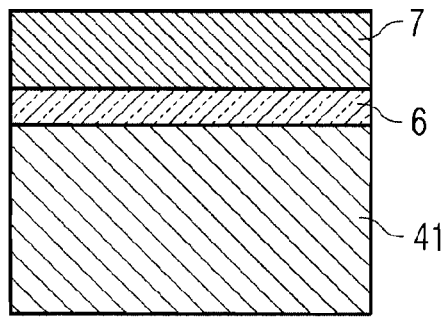
FIG. 14 is a cross-sectional view of a further semiconductor arrangement.

FIG. 14 illustrates a semiconductor arrangement 1100 including a conductive structure 41 made of a semiconductor material and a metallic element 7, between which a carbon-based barrier layer 6 is arranged. Design, materials and methods for manufacturing of the carbon-based barrier layer 6 and the metallic element 7 may be the same as described above. The conductive structure 41 may be made of a semiconductor material of relatively high electrical conductivity, such as polycrystalline silicon or highly doped silicon. The semiconductor arrangement 1100 represents an electrically conducting structure used in semiconductor technology to pass electrical signals via the conductive structure 41 to the metallic element 7 or vice versa. The carbon-based barrier layer 6 is used to allow a high electrical conductivity and also serves to inhibit the diffusion of metal atoms through the carbon-based barrier layer 6.

Figure 15:
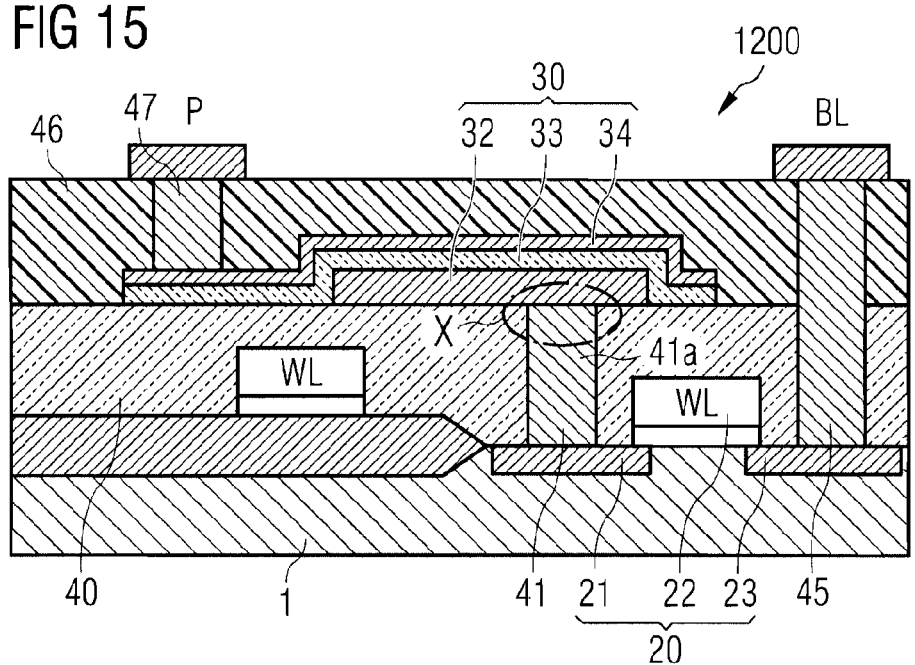
FIG. 15 is a cross-sectional view of a semiconductor device.
Figure 16:
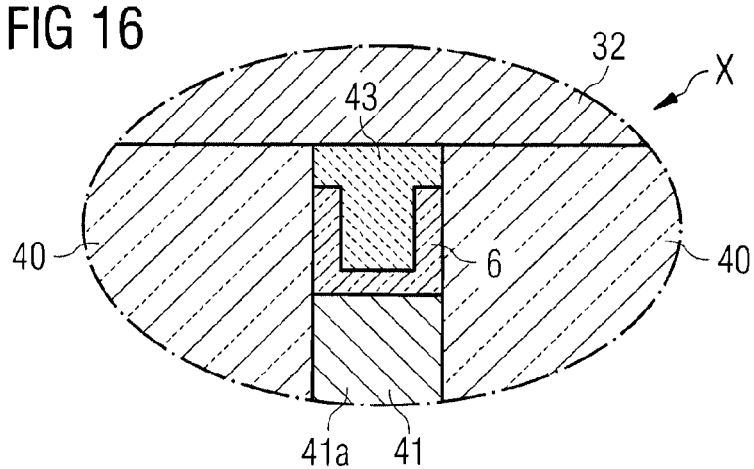
FIG. 16 is a cross-sectional view of detail X in FIG. 15.

FIGS. 15 and 16 illustrate an example of the embodiment depicted in FIG. 14. FIG. 15 illustrates a sectional view through a semiconductor arrangement of a DRAM memory cell 1200. The memory cell 1200 includes a semiconductor substrate 1, on which a MOS transistor 20 is arranged. To this end, a drain region 21 and a source region 23 are formed by doping the semiconductor substrate 1 appropriately. The gate 22 of the MOS transistor 20 representing the word-line WL of the memory cell 1200 is arranged over the channel separating the drain region 21 and the source region 23. The source region 23 is connected to a bit-line BL via a vertical conductive structure 45.

The MOS transistor 20 is covered by a planarized insulation layer 40 made e.g., of a silicon oxide or silicon nitride. A memory capacitor 30 having a lower electrode 32, an upper electrode 34 and a dielectricum material 33 sandwiched by the lower and upper electrodes 32, 34 is formed on the insulation layer 40. The dielectricum layer 33 may e.g., be made of a ferroelectric material. The memory capacitor 30 is covered by a second insulation layer 46, e.g., silicon oxide or silicon nitride. This second insulation layer 46 includes a contact hole through which a conductive vertical structure 47 connects the upper electrode 34 to an external electrical terminal P.

The drain region 21 of the MOS transistor 20 is electrically connected via a vertical conductive structure 41 to the lower electrode 32 of the memory capacitor 30. The design of the vertical conductive structure 41 at the transition to the lower electrode 32 of the MOS capacitor 30, i.e. detail X of FIG. 15, is illustrated in FIG. 16. As known in the art, the vertical conductive structure 41 (also referred to as "plug" in the art) is made of e.g., polycrystalline silicon 41a. In order to prevent metal atoms from the lower electrode 32 of the memory capacitor 30 to diffuse into the polycrystalline silicon 41a of the vertical contact structure 41, a carbon-based diffusion barrier 5 is arranged to cover the upper surface of the polycrystalline silicon 41a of the vertical contact structure 41. The carbon-based diffusion barrier 5 may be produced by any of the aforementioned methods and may be doped and/or intercalated as described further above. It is to be noted that the specific electric resistance of doped and/or intercalated carbon is significantly lower than the specific electric resistance of highly doped polycrystalline silicon as used for the part 41a of the vertical contact structure 41. Further, the thermal conductivity of the carbon-based barrier layer 6 is higher than the thermal conductivity of highly doped polycrystalline silicon in part 41a of the vertical conduct structure. Thus, the carbon-based barrier layer 6 illustrates superior electrical and thermal behavior and further impedes metal atoms of the lower electrode 32 (which may e.g., be made of Pt, Al or Cu) to diffuse into the polycrystalline silicon material 41a of the plug.

As illustrated in FIG. 16 an optional oxide barrier layer 43 may be arranged between the lower electrode 32 and the carbon-based barrier layer 6. The oxide barrier layer 43 may be made e.g., of Ir or IrO and is intended to prevent oxygen to enter into polycrystalline silicon 41a. As the carbon-based barrier layer 6 may also absorb oxygen without significant loss of electric conductivity, the oxygen barrier layer 43 may be omitted.

It is to be noted that the carbon-based barrier layer 6 may, in principle, be implemented in any conductive structure in which metal atoms from a conductive metal element are to be prevented from penetrating into another conductive material such as silicon, polycrystalline silicon or silicide which is separated and protected by the carbon-based barrier layer 6. Thus, a variety of applications other than that exemplified in FIGS. 15 and 16 are apparent for a person skilled in the art of semiconductor technology.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a semiconductor arrangement comprising:
   a conductive structure comprising polycrystalline silicon or highly doped silicon;
   a metallic element; and
   a carbon-based barrier layer disposed between the conductive structure and the metallic element and in direct contact with at least the conductive structure, the carbon-based barrier layer completely covering a border between the conductive structure and the metallic element and being doped so as to be electrically conductive to pass electrical signals from the conductive structure to the metallic element.

2. The integrated circuit of claim 1, further comprising:
   an oxide layer arranged between the carbon-based barrier layer and the metallic element.

3. The integrated circuit of claim 2, wherein the oxide layer comprises iridium or iridium oxide.

4. The integrated circuit of claim 1, wherein the carbon-based barrier layer physically separates the conductive structure from the metallic element.

5. The integrated circuit of claim 1, wherein the specific electric resistance of the carbon-based barrier layer is lower than the specific electric resistance of the conductive structure.

6. The integrated circuit of claim 1, wherein the thermal conductivity of the carbon-based barrier layer is higher than the thermal conductivity of the conductive structure.

* * * * *